(12) United States Patent
Hardee et al.

(10) Patent No.: US 8,270,621 B2
(45) Date of Patent: Sep. 18, 2012

(54) AUTOMATIC GENERATION OF AUDIBLE ALERT ACCORDING TO AMBIENT SOUND

(75) Inventors: Christopher J. Hardee, Raleigh, NC (US); Adam Roberts, Moncure, NC (US); Donna C. Hardee, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 733 days.

(21) Appl. No.: 12/369,108

(22) Filed: Feb. 11, 2009

(65) Prior Publication Data

US 2010/0202622 A1    Aug. 12, 2010

(51) Int. Cl.
*H03G 3/20* (2006.01)
(52) U.S. Cl. .......................................... 381/56; 381/101
(58) Field of Classification Search ...................... 381/56
See application file for complete search history.

(56) References Cited

U.S. PATENT DOCUMENTS

| | | | | |
|---|---|---|---|---|
| 5,844,983 A | * | 12/1998 | Lilja | 379/418 |
| 6,246,761 B1 | * | 6/2001 | Cuddy | 379/418 |
| 6,954,657 B2 | * | 10/2005 | Bork et al. | 455/567 |
| 7,024,229 B2 | * | 4/2006 | Nishimura | 455/567 |
| 7,353,167 B2 | | 4/2008 | Puterbaugh et al. | |
| 2002/0006207 A1 | * | 1/2002 | Matero et al. | 381/57 |
| 2005/0113147 A1 | * | 5/2005 | VanEpps et al. | 455/567 |
| 2008/0043999 A1 | | 2/2008 | Stenmark et al. | |
| 2008/0304672 A1 | * | 12/2008 | Yoshizawa et al. | 381/56 |
| 2011/0200210 A1 | * | 8/2011 | Kemmochi | 381/107 |

OTHER PUBLICATIONS

"Consonance and Dissonance", bland@indiana.edu, Nov. 13, 2008, pp. 1-4.

* cited by examiner

*Primary Examiner* — Benjamin Sandvik
(74) *Attorney, Agent, or Firm* — Cynthia G. Seal; Jeffrey L. Streets

(57) ABSTRACT

In one embodiment, ambient sound in audible range of a telephone is electronically sampled, and an audible alert is automatically generated in response to an incoming call signal as a function of the sampled ambient sound. The ambient sound sample may be analyzed in terms of selected parameters such as frequency, amplitude, and tempo. The audible alert may then be generated as a function of the selected parameters in such a way that the audible alert is more noticeable in the presence of the ambient sound. For example, an alert frequency that is dissonant with an identified frequency of the ambient sound may be generated.

18 Claims, 3 Drawing Sheets

AUTOMATIC GENERATION OF AUDIBLE ALERT ACCORDING TO AMBIENT SOUND

BACKGROUND OF THE INVENTION

1. Field of the Invention

The present invention relates to telephones and, more specifically, to telephone ring tones.

2. Background of the Related Art

Telephones, including landline, cellular, and Internet-based phones, typically provide an alert to indicate an incoming phone call. The most common incoming call alert type is an audible alert (colloquially referred to as a "ring tone"), although visual alerts and vibrations, either separately or in combination, are also commonly used to indicate an incoming call. Technology has enabled a wide range of sophisticated, manually user-selectable audible alerts. For example, polyphonic ring tones, musical sound clips and even user-created audible alerts are among the commonly available audible alerts.

Despite the plethora of alert options, missed calls remain a problem. One cause of missed telephone calls is the difficulty of hearing an audible alert due to ambient sound, sometimes referred to as ambient noise or background noise because of its ability to interfere with hearing the audible alert. Familiar examples of ambient sound sources include a nearby television or radio, road noise in an automobile, a crowd at a sporting event, or music at a concert. Visual alerts and vibrations can be helpful, but do not eliminate the potential for missed calls due to ambient sound. For example, a visual alert may go unnoticed if the phone is not in view, and even a vibrating alert may be unnoticeable in a noisy environment or during physical activity.

BRIEF SUMMARY OF THE INVENTION

One embodiment of the present invention provides a computer-implemented method that includes electronically sampling ambient sound in audible range of a telephone and, in response to an incoming call signal, automatically generating an audible alert in audible range of the telephone as a function of the ambient sound. For example, the audible alert may include a frequency that is dissonant or maximally dissonant with an identified frequency of the ambient sound.

Another embodiment of the invention provides a telephone system. The telephone system includes a transceiver configured for communication on a telephone line. The transceiver includes a microphone configured for generating electronic representation of sound to be transmitted over a telephone line and a receiver configured for reproducing electronic representation of sound received over a telephone line. An ambient sound microphone is included for sampling ambient sound audible at the location of the transceiver. An audible alert module is configured for automatically generating an audible alert as a function of the ambient sound in response to an incoming call signal.

DETAILED DESCRIPTION OF THE INVENTION

The present invention includes systems and methods for generating an audible alert as a function of presently detected ambient sound so that the audible alert is more easily distinguished in the presence of the ambient sound. The ambient sound may be sampled and analyzed in terms of parameters such as frequency, amplitude, and tempo. Such sampling and analysis is performed in response to determining that an audible alert should be generated, such as in response to an incoming telephone call. An audible alert may then be generated as a function of those parameters in a way that makes the audible alert more noticeable in the presence of the ambient sound. For example, the audible alert may be generated with at least one frequency that is computed to be dissonant with an identified frequency of the ambient sound. Example embodiments of the present invention are discussed below in the context of generating a ring tone to draw attention to a phone call. However, it should be recognized that the described embodiments could be extended to generating audible alerts as a function of ambient sound for other types of events, such as a text message or calendar reminder, or other electronic devices, such as an alarm clock, a car or home security alarm, or a microwave oven.

Figure 1:
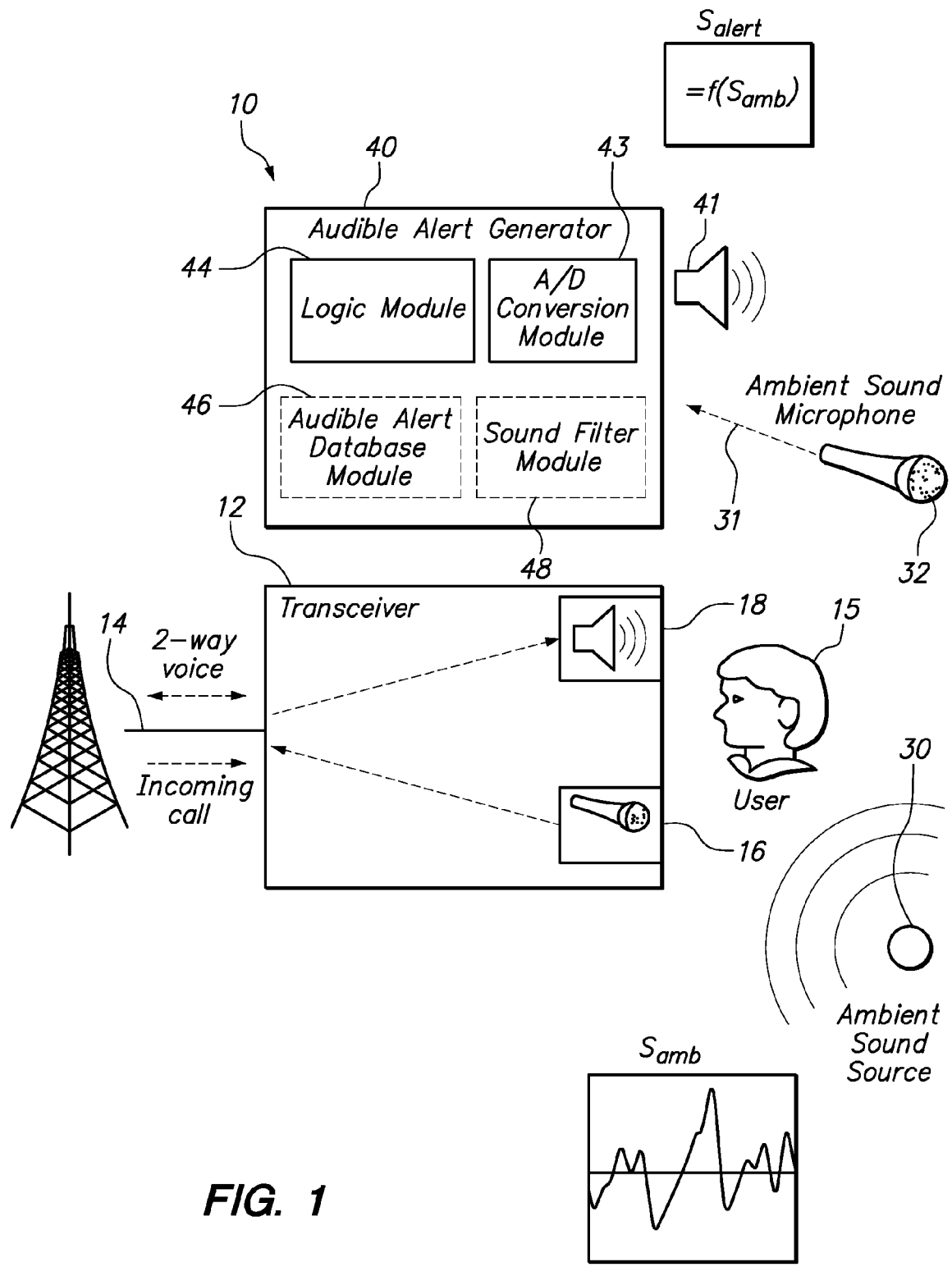
FIG. 1 is a schematic diagram of a telephone system configured to sample ambient sound and automatically generate an audible alert as a function of the sampled ambient sound.

FIG. 1 is a schematic diagram of a telephone system 10 that, according to one or more embodiments of the invention, samples ambient sound and automatically generates an audible alert as a function of the ambient sound. As an overview, the telephone system 10 includes a transceiver 12 connected with a telephone line 14, allowing a user 15 to communicate with another party (not shown) over the telephone line 14. The user 15 may be the sole user of the telephone system 10 or one of multiple participants in a conference call at the location of the telephone system 10. The user 15 may, acting as a "caller," place a call from the telephone system 10 to another party. Alternatively, the user 15 may, acting as a "callee," receive a call placed by a caller to a telephone extension to which the telephone system 10 is connected. The user 15 may also "patch in" to an active call on the telephone line 14, such as by having the active call transferred to the user's extension.

The telephone system 10 and telephone line 14 may be matched according to any of a variety of types of telephony. For example, the telephone system 10 and telephone line 14 may be configured for landline telephone communication, for mobile telephone communication, or for an Internet-based telephone communication. In the case of landline telephone communication, a call to or from the telephone system 10 over the telephone line 14 may be conducted using "plain old telephone service" (POTS). In the case of mobile telephone communication, a call to or from the telephone system 10 over the telephone line 14 may be conducted using any of the various mobile communication standards, such as GSM (Global System for Mobile Communications), UMTS (Universal Mobile Telecommunications System), or CDMA (Code Division Multiple Access). In the case of Internet-based telephone communication, a call to or from the telephone system 10 over the telephone line 14 may be conducted using, for example, VoIP (Voice over Internet Protocol).

The user 15 can communicate during a call using the transceiver 12, which includes a voice microphone 16 and a speaker 18. In the case of a landline telephone, the voice microphone 16 and speaker 18 of the transceiver 12 may be provided with a handset or a "hands-free" speakerphone. In the case of a mobile telephone, the voice microphone 16 and speaker 18 may be provided in the body of the mobile phone or provided in a "hands-free" headset or earpiece connected to the mobile phone by wire or wireless (e.g. Bluetooth®) connection. In the case of an Internet-based telephone, the voice microphone 16 and speaker 18 may be connected to a computer on which VoIP telephony is enabled, as optionally provided with a headset connected to the computer over a wired or wireless connection. The voice microphone 16 is configured to generate an electronic signal in response to sound in detectable range of the voice microphone 16, which typically includes the voice of the user 15, for transmission over the phone line 14. The speaker 18 produces sound according to the electronic signals received by the transceiver 12, at a level normally intended to be audible to the user 15. The electronic signals received by the transceiver 12 over the phone line 14 may include, for example, the voice of another party or computer-generated audio, such as voice-menu prompts or hold music, transmitted to the telephone system 10. The transceiver 12 therefore provides a way for the user 15 to speak and listen in a conventional manner during a phone call.

An incoming call signal is received by the telephone system 10. The incoming call signal may be an electronic signal generated in response to a party dialing the telephone number or extension to which the telephone system 10 is connected or an electronic signal sent to the that extension to summon the user 15 to an active call. In response to the incoming call signal, an Audible Alert Generator 40 generates an audible alert that is sounded by a ringer 41. However, an ambient sound source 30 and the ringer 41 are simultaneously within audible range of the user 15. Therefore, according to any of a variety of methods discussed below, the Audible Alert Generator 40 generates the audible alert as a function of the ambient sound existing at or near that point in time in such a way that the audible alert is more easily distinguishable in the presence of the ambient sound. The user 15 may response to the audible alert by answering the incoming call. In response to the user 15 answering the call, the user Audible Alert Generator 40 ceases to sound the audible alert.

The Audible Alert Generator 40 in this embodiment includes an ambient sound microphone 32, which converts the acoustic energy of one or more ambient sound source 30 into a corresponding analog electrical signal 31. An analog-to-digital converter 43 transforms that analog electrical signal 31 into a digital representation of the ambient sound sample, designated in FIG. 1 as "$S_{amb}$." The Audible Alert Generator 40 analyzes the ambient sound sample $S_{amb}$ and generates an audible alert $S_{alert}$ as a function of $S_{amb}$. For example, the Audible Alert Generator 40 may generate the audible alert wherein parameters of the alert such as frequency, amplitude, or tempo are selected as a function of like parameters of the ambient sound sample $S_{amb}$.

The ringer 41 may be in audible range of the ambient sound microphone 32. Thus, an optional Sound Filter Module 48 is included with Audible Alert Generator 40 for filtering out the sound of the audible alert $S_{alert}$, itself, from the ambient sound sample. Various sound filtering technologies known in the art may be used for this purpose.

The task of generating an audible alert having the selected parameters may be accomplished using any of a variety of methods. According to one method, an optional Audible Alert Database Module 46 is provided, which may contain predefined audible alerts. A Logic Module 44 may generate the audible alert by selecting one of the predefined audible alerts that will be most distinguishable in the presence of the ambient sound. The alert that is most distinguishable may be selected as a function of parameters of the ambient sound sample $S_{amb}$. In another method, the optional Audible Alert Database Module 46 may contain predefined alert templates that are customizable according to the selected parameters (e.g. frequency, tempo, or amplitude). For example, a predefined alert template may be selected and customized to include the audible alert parameters selected as a function of the ambient sound parameters. In yet another method, the Logic Module 44 may generate a new audible alert as a function of parameters of the ambient sound sample $S_{amb}$, without using a predefined alert or alert template.

It should be recognized that sound may include multiple sound components. For example, ambient sound may include multiple people talking in a crowd or multiple instruments playing at a musical performance, each of which may be separately treated as a component of the ambient sound. As another example, a chord sounded by a single instrument includes multiple notes, each at a different frequency, which may be treated as components of the resulting sound. Even the sound of a single plucked guitar string or the sound of a single voice are not pure tones, but instead are complex waveforms having multiple sound components, such as a primary frequencies and various harmonics. The various components of the ambient sound combine to produce an aggregate waveform that is heard by a listener.

Figure 2:
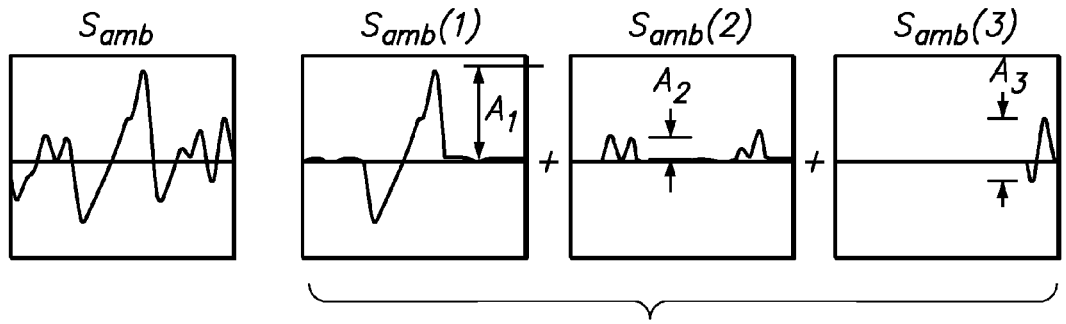
FIG. 2 is a schematic diagram conceptually illustrating the analytical separation of the ambient sound sample into components.

FIG. 2 is a schematic diagram conceptually illustrating the analytical separation of the ambient sound sample $S_{amb}$ into three exemplary components $S_{amb}(1)$, $S_{amb}(2)$, and $S_{amb}(3)$. Each ambient sound component $S_{amb}(1)$, $S_{amb}(2)$, and $S_{amb}(3)$ may have different parameters, such as frequency, amplitude, and tempo. For example, component $S_{amb}(1)$ has an amplitude A1 that is larger than the amplitudes A2 and A3 of the other components $S_{amb}(2)$ and $S_{amb}(3)$. An audible alert may be generated as a function of one or more of the sound components according to their respective parameters. For example, an alert may be more likely to be distinguishable to a user if it is distinguishable from a sound component having a high amplitude, rather than being distinguishable from a sound component having a lower amplitude.

Figure 3:
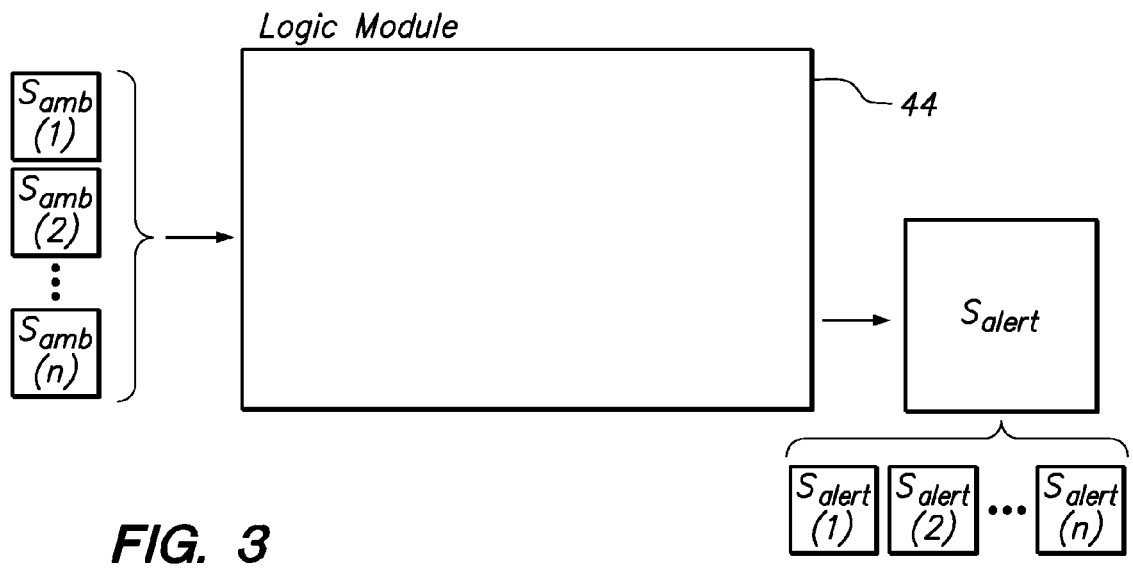
FIG. 3 is a schematic diagram illustrating a method of generating an audible alert as a function of identified components of the ambient sound sample.

FIG. 3 is a schematic diagram illustrating a method, according to an embodiment of the invention, of generating an audible alert as a function of analytically determined components of the ambient sound sample $S_{amb}$. The ambient sound sample $S_{amb}$ is separated analytically into any number "n" of components $S_{amb}(1)$ to $S_{amb}(n)$ and analyzed by the Logic Module 44 to generate an audible alert $S_{alert}$ as a function of the ambient sound sample $S_{amb}$. The audible alert, itself, may include one or more components $S_{alert}(1)$ to $S_{alert}(n)$. For example, each component $S_{alert}(n)$ may be selected as a function of a respective component $S_{amb}(n)$ of the ambient sound sample $S_{amb}$. The components $S_{alert}(n)$ may be combined into an aggregate waveform or otherwise sounded together to produce the audible alert $S_{alert}$. The ambient sound will typically be dynamic, constantly changing in terms of parameters such as frequency, amplitude, and/or tempo.

Therefore, the audible alert $S_{alert}$ may be dynamically generated as a function of the dynamically changing ambient sound.

One embodiment of a method for generating an audible alert that is very noticeable in the presence of ambient noise includes generating an audible alert having sounds that are dissonant with the ambient sound. Dissonance may be qualitatively described as a mingling of discordant sounds. Dissonant frequencies clash with one another, which a listener will interpret as sounding harsh or rough together. Therefore, to generate an audible alert that is more easily distinguishable in the presence of ambient sound, the audible alert may be generated using one or more frequencies that are dissonant with one or more identified frequencies of ambient sound.

Dissonant frequencies can be objectively determined by selecting two frequencies from within the same "critical band," but that are at least about 10 Hz apart. As generally understood in the art, the frequency range of audible sounds is divided into roughly 24 critical bands, each having a central frequency and a bandwidth about the central frequency. For sounds with a frequency of greater than 1000 Hz, the critical bandwidth is approximately 15% of the central frequency of the band. For example, for a critical band centered at 10,000 Hz, the critical bandwidth is 1500 Hz and extends from about 9,250 Hz to about 10,750 Hz.

It is further understood in the art that two frequencies with a frequency difference of about 30% of the associated critical bandwidth are "maximally dissonant." For example, 9500 Hz is within the critical band centered at 10,000 Hz and has a critical bandwidth of 1500 Hz. Thirty percent of this critical bandwidth is 30%×1500 Hz=450 Hz. Thus, the two frequencies 9500 Hz and 9950 Hz are maximally dissonant to each other. In the parlance of musical theory, two notes one semitone apart are said to be maximally dissonant. For example, the musical notes F and F-sharp played together are maximally dissonant.

Figure 4:
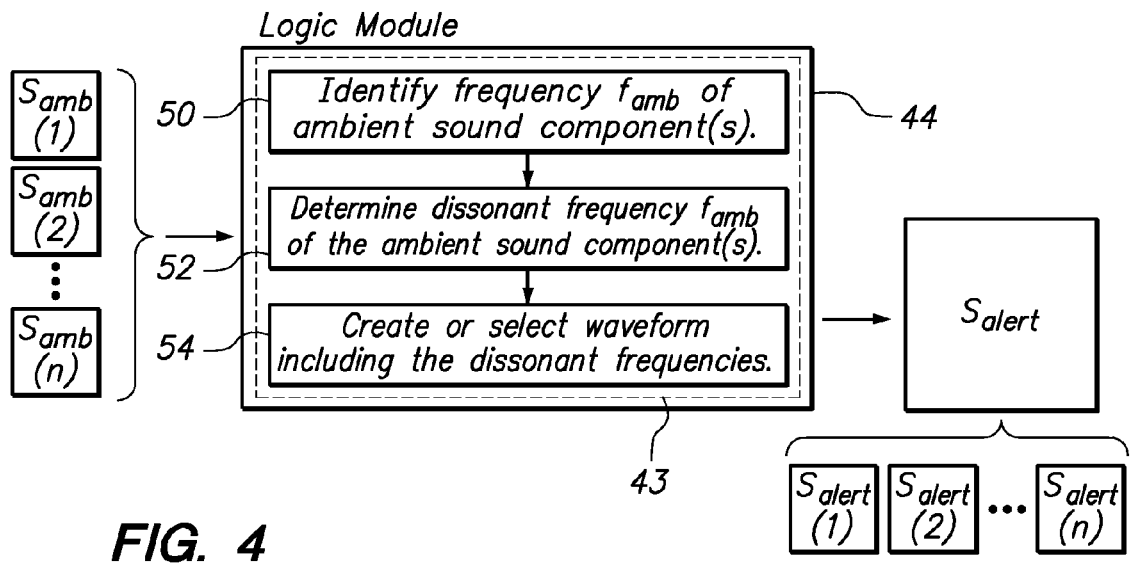
FIG. 4 is a schematic diagram illustrating a method of generating an audible alert having one or more components that are dissonant with one or more components of the ambient sound sample.

FIG. 4 is a schematic diagram illustrating a method, according to an embodiment of the invention, of generating an audible alert having one or more components $S_{alert}(n)$ that are dissonant with one or more components of the ambient sound sample $S_{amb}$. The ambient sound sample $S_{amb}$ is optionally separated analytically into components $S_{amb}(1)$ to $S_{amb}(n)$ and input to a subset 43 of the Logic Module 44 directed to the selection of dissonant frequencies. In step 50, the frequency of a selected ambient sound component $S_{amb}(n)$ is identified. In step 52, a dissonant frequency famb is computed as a function of the selected ambient sound components $S_{amb}(n)$. Step 52 may be performed for as few as one or as many as all of the identified ambient sound components $S_{amb}(n)$.

In particular, step 52 may involve determining an $f_{alert}$ is within the same critical bandwidth as $f_{amb}$. Optionally, maximal dissonance may be achieved by selecting $f_{alert}$ about 30% of the associated critical bandwidth apart from $f_{amb}$. In a simple example, if the ambient sound sample Samb is determined to include the musical note "F" at a particular moment, maximal dissonance with the identified "F" note may be created by generating an audible alert containing the musical note "F sharp" at that same moment. More generally, an audible alert may be generated wherein $f_{alert}$ and $f_{amb}$ are at least highly dissonant (if not maximally dissonant) by selecting $f_{alert}$ such that the difference between $f_{alert}$ and $f_{amb}$ is within a range of between 25 and 30 percent of the associated critical bandwidth.

In step 54, a waveform is generated that includes the one or more dissonant frequencies determined according to step 52. An audible alert $S_{alert}$ is then generated that representative of the waveform generated in step 54. Step 54 may be accomplished using any of a variety of methods. In a first exemplary method, the waveform of the audible alert may be generated by selecting a predefined audible alert from an audible alert database that includes the desired dissonant frequencies. In a second method, the audible alert may be generated by selecting a predefined sound pattern or template from a database and customizing the sounding or "playback" of the sound pattern to include the desired dissonant frequencies.

Figure 5:
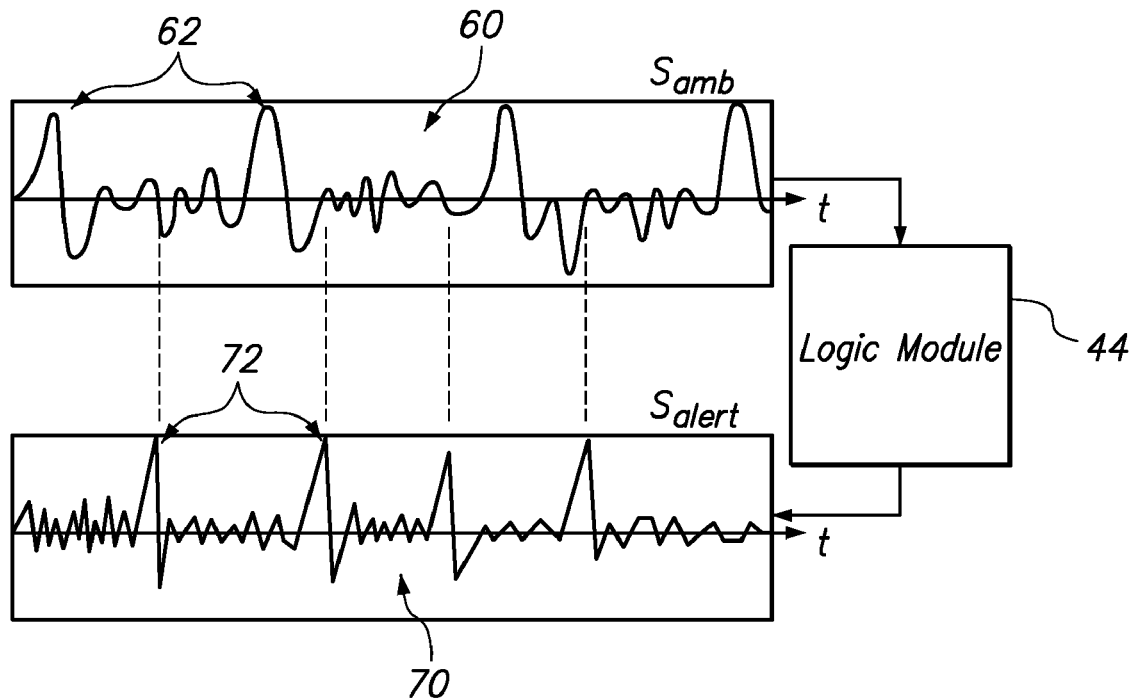
FIG. 5 is a schematic diagram of a method of dynamically generating and controlling an audible alert tempo or frequency as a function of the ambient sound tempo or frequency.

FIG. 5 is a schematic diagram of a method, according to an embodiment of the invention, of dynamically generating and controlling an audible alert tempo as a function of the tempo of the ambient sound or a component thereof, to further distinguish the audible alert from the ambient sound. An extended ambient sound sample $S_{amb}$ is characterized by an ambient waveform 60 having regularly recurring "beats" 62. Such a waveform 60 may describe, for example, the sound of rhythmical background music or noisy machinery operating according to a periodic motion. The waveform 60 of the ambient sound sample $S_{amb}$ is analyzed by the Logic Module 44 to output an audible alert $S_{alert}$ having a representative alert waveform 70, wherein beats 72 of the audible alert $S_{alert}$ are deliberately mismatched with the regularly recurring beats 62. As indicated by dashed vertical reference lines, the beats 72 of the alert waveform 70 do not coincide with the beats 62 of the ambient waveform 60 and do not occur at regular intervals between the beats 62 of the ambient waveform. Moreover, the "tempo" of the alert waveform 70 is intentionally mismatched with respect to the tempo of the ambient waveform 60. As a result, the audible alert $S_{alert}$ is unlikely to blend in with the ambient sound $S_{amb}$ and will therefore be more noticeable in the presence of the ambient sound. The tempo mismatch illustrated in FIG. 5 may be combined with the introduction of dissonance discussed above.

The method illustrated in FIG. 5 may be used if the ambient sound includes sound with a discernable rhythm or tempo. Some algorithms are known in the art for detecting tempo or rhythm of a sound source. Such algorithms may be used to determine a tempo of the ambient sound sample $S_{amb}$. The Logic Module 44 may automatically adjust a tempo of the audible alert to be out-of-tempo with the ambient sound. The audible alert may include, for example, a predefined melody or rhythmical audio file. The tempo of the predefined melody or rhythmical audio file could be automatically adjusted to be a tempo other than the tempo of the ambient sound. More particularly, the audible alert could be played back at a tempo such that beats 72 fall unevenly between the beats 62 of the ambient sound, as shown. Again, the tempo of the audible alert may be dynamically adjusted in response to a dynamically changing tempo of the ambient sound.

Figure 6:
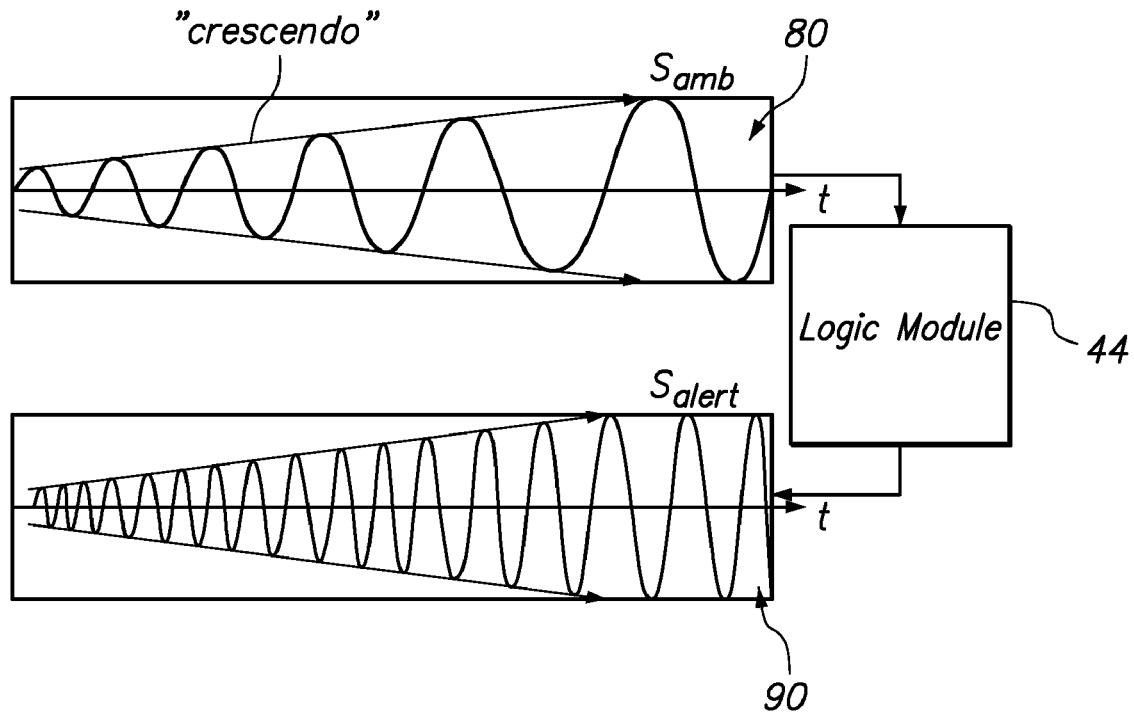
FIG. 6 is a schematic diagram of a method of dynamically controlling an audible alert volume as a function of the ambient sound volume.

FIG. 6 is a schematic diagram of a method, according to an embodiment of the invention, of dynamically controlling an audible alert volume as a function of the volume of the ambient sound or a component thereof, to further distinguish the audible alert from the ambient sound. An extended ambient sound sample $S_{amb}$ is characterized by an ambient waveform 80. The amplitude of the waveform 80 increases over time during the interval in which the ambient sound sample $S_{amb}$ was taken, indicating an increase in volume or "crescendo" of the ambient sound. The Logic Module 44 dynamically adjusts the amplitude of the waveform 90 as a function of the amplitude of the waveform 90 of the audible alert $S_{alert}$. The practical affect of such a method is to automatically adjust the volume of the audible alert as a function of the volume of the ambient sound. The volume of the audible alert (or component thereof) may be automatically increased in response to an increase in the volume of the ambient sound and automatically decreased in response to a decrease in the volume of the ambient sound. Thus, the volume of the audible alert may be dynamically adjusted so that it is not drowned out by increases in volume of the ambient sound. This increases the likelihood that a user will hear the audible alert.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may be communicated by a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
   electronically sampling ambient sound in audible range of a telephone;
   analytically separating the ambient sound into a plurality of ambient sound components having different values of one or more parameters; and
   in response to an incoming call signal, automatically generating a plurality of alert components each selected as a function of a respective one of the plurality of ambient sound components, and combining the plurality of alert components to produce an audible alert in audible range of the telephone.

2. The computer-implemented method of claim 1, further comprising:
   dynamically sampling the ambient sound; and
   dynamically generating the audible alert as a function of the dynamically detected ambient sound.

3. The computer-implemented method of claim 2, further comprising:
   filtering out the dynamically generated audible alert from the dynamically sampled ambient sound.

4. The computer-implemented method of claim 1, further comprising:
   determining a frequency of a selected ambient sound component; and
   generating a frequency of the audible alert as a function of the frequency of the selected ambient sound component.

5. The computer-implemented method of claim 1, further comprising:
   identifying a frequency of a selected ambient sound component; and
   generating an audible alert frequency within the same critical band and at least 10 Hz apart from the identified frequency of the selected ambient sound component.

6. The computer-implemented method of claim 1, further comprising:
   identifying a frequency of a selected ambient sound component; and
   generating an audible alert frequency within the same critical band and within 15 percent of the identified frequency of the selected ambient sound component.

7. The computer-implemented method of claim 1, further comprising:
   identifying a frequency of a selected ambient sound component; and
   generating an audible alert frequency within the same critical band as the identified frequency and having a frequency difference of between 25 to 30 percent of the critical bandwidth.

8. The computer-implemented method of claim 4, further comprising:
   identifying a frequency of a selected ambient sound component; and
   generating an audible alert frequency of more than one octave apart from the identified frequency of the selected ambient sound component.

9. The computer-implemented method of claim 1, further comprising:
   determining a tempo of a selected ambient sound component; and
   generating the audible alert with a tempo distinct from the tempo of the selected ambient sound component.

10. The computer-implemented method of claim 1, further comprising:
    determining an amplitude of the sampled ambient sound; and
    selectively adjusting the volume of the audible alert over time as a function of the amplitude.

11. A computer program product including computer usable program code embodied on a non-transitory computer usable storage medium, comprising:
    computer usable program code for electronically sampling ambient sound in audible range of a telephone;
    computer usable program code for analytically separating the ambient sound into a plurality of ambient sound components having different values of one or more parameters and
    computer usable program code for, in response to an incoming call signal, automatically generating a plurality of alert components each selected as a function of a respective one of the plurality of ambient sound components, and combining the plurality of alert components to produce an audible alert in audible range of the telephone.

12. The computer program product of claim 11, further comprising:
    computer usable program code for dynamically sampling the ambient sound; and
    computer usable program code for dynamically generating the audible alert as a function of the dynamically detected ambient sound.

13. The computer program product of claim 11, further comprising
    computer usable program code for identifying a frequency of a selected ambient sound component; and
    computer usable program code for generating a frequency of the audible alert as a function of the frequency of the selected ambient sound component.

14. The computer program product of claim 11, further comprising:
    computer usable program code for identifying a frequency of a selected ambient sound component; and
    computer usable program code for generating an audible alert frequency within the same critical band and at least 10 Hz apart from the identified frequency of the selected ambient sound component.

15. The computer program product of claim 11, further comprising:
    computer usable program code for identifying a frequency of the selected ambient sound component; and
    computer usable program code for generating an audible alert frequency within the same critical band and within 15 percent of the identified frequency of the selected ambient sound component.

16. The computer program product of claim 11, further comprising:
    computer usable program code for identifying a frequency of the selected ambient sound component; and
    computer usable program code for generating an audible alert frequency within the same critical band as the identified frequency and having a frequency difference of between 25 to 30 percent of the critical bandwidth.

17. A telephone system, comprising:

a transceiver configured for communication on a telephone line, the transceiver including a microphone configured for generating electronic representation of sound to be transmitted over a telephone line and a receiver configured for reproducing electronic representation of sound received over a telephone line;

an ambient sound microphone for sampling ambient sound audible at the location of the transceiver; and an audible alert module configured for analytically separating the ambient sound into a plurality of ambient sound components each having different values of one or more parameters and automatically generating a plurality of alert components each selected as a function of a respective one of the plurality of ambient sound components and combining the plurality of alert components to produce an audible alert in response to an incoming call signal.

18. The telephone system of claim 17, wherein the audible alert module further comprises a sound filter module for filtering out at least a portion of the sounded audible alert from the sampled ambient sound.

* * * * *